United States Patent
Bian et al.

(10) Patent No.: US 7,842,192 B2
(45) Date of Patent: Nov. 30, 2010

(54) MULTI-COMPONENT BARRIER POLISHING SOLUTION

(75) Inventors: Jinru Bian, Newark, DE (US); Zhendong Liu, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 156 days.

(21) Appl. No.: 11/349,863

(22) Filed: Feb. 8, 2006

(65) Prior Publication Data

US 2007/0184661 A1    Aug. 9, 2007

(51) Int. Cl.
*C09K 13/00* (2006.01)

(52) U.S. Cl. ............ 252/79.1; 438/693; 438/427; 216/88; 252/79.5

(58) Field of Classification Search ......... 438/692, 438/693, 427; 216/88; 252/79.1, 79.5
See application file for complete search history.

(56) References Cited

U.S. PATENT DOCUMENTS

| | | | | |
|---|---|---|---|---|
| 6,046,112 | A * | 4/2000 | Wang | 438/693 |
| 6,443,811 | B1 * | 9/2002 | Nojo et al. | 451/41 |
| 6,447,563 | B1 * | 9/2002 | Mahulikar | 51/309 |
| 6,964,600 | B2 | 11/2005 | Belov et al. | |
| 6,971,945 | B2 | 12/2005 | Lui et al. | |
| 7,018,560 | B2 | 3/2006 | Liu et al. | |
| 2004/0060502 | A1 | 4/2004 | Singh | |
| 2005/0029491 | A1 | 2/2005 | Liu | |
| 2005/0031789 | A1 * | 2/2005 | Liu et al. | 427/340 |
| 2005/0066585 | A1 | 3/2005 | Bian et al. | |
| 2005/0108949 | A1 * | 5/2005 | Matsuda et al. | 51/308 |
| 2005/0236601 | A1 | 10/2005 | Liu et al. | |

FOREIGN PATENT DOCUMENTS

WO    WO 02/083804 A1    10/2002

OTHER PUBLICATIONS

STIC Search Result, Chemical Abstract, including US Patent 6447563, (Sep. 10, 2002), pp. 65 to 68.*

* cited by examiner

*Primary Examiner*—Nadine G Norton
*Assistant Examiner*—Mahmoud Dahimene
(74) *Attorney, Agent, or Firm*—Blake T. Biederman

(57) ABSTRACT

The polishing solution is useful for removing barrier materials in the presence of at least one nonferrous interconnect metal with limited erosion of dielectrics. The solution contains 0 to 20 weight percent oxidizer, at least 0.001 weight percent inhibitor for reducing removal rate of the nonferrous interconnect metals, 1 ppm to 4 weight percent organic-containing ammonium cationic salt formed with a quanternary ammonium structure, 1 ppm to 4 weight percent anionic surfactant, the anionic surfactant having 4 to 25 carbon atoms and the total carbon atoms in of the ammonium cationic salt plus the anionic surfactant being 6 to 40 carbon atoms, 0 to 50 weight percent abrasive and balance water; and the solution having a pH of less than 7.

11 Claims, No Drawings

MULTI-COMPONENT BARRIER POLISHING SOLUTION

BACKGROUND OF THE INVENTION

The invention relates to chemical mechanical planarizing (CMP) formulations for removing barrier metals and, more particularly, to polishing compositions for selectively removing barrier metals in the presence of interconnect structures in integrated circuit devices.

In recent years, the semiconductor industry has increasingly relied upon copper electrical interconnects in forming integrated circuits. These copper interconnects have a low electrical resistivity and a high resistance to electromigration. Since copper is very soluble in many dielectric materials, such as silicon dioxide and low-K or doped versions of silicon dioxide, a diffusion barrier layer is necessary to prevent the diffusion of copper into the underlying dielectric material. Typical barrier materials include, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

In response to increasing demands for high density integrated circuits, semiconductor producers now fabricate integrated circuits containing multiple overlying layers of metal interconnect structures. During device fabrication, planarizing each interconnect layer improves packing density, process uniformity, product quality and most importantly, enables manufacturing of multiple layer integrated circuits. Semiconductor producers rely upon chemical-mechanical-planarizing (CMP) as a cost effective means of producing flat substrate surfaces. The CMP process is typically carried out in a two-step sequence. First, the polishing process uses a "first-step" slurry specifically designed to rapidly remove copper.

After the initial copper removal, a "second-step" slurry removes the hard barrier material. Typically, second-step slurries require excellent selectivity to remove the barrier material without adversely impacting the physical structure or electrical properties of the interconnect structure. Because high-conductivity interconnect metals, such as copper are softer than typical barrier materials, such as tantalum nitride and titanium nitride, conventional bulk copper removal slurries are not useful for barrier applications. Acidic barrier slurries accomplish the selectivity by introducing sufficient benzotriazole into the slurry to decrease the copper removal rate.

Tunability of the copper and dielectric, such as TEOS, rates in the barrier polishing step is important. For purposes of this specification, TEOS represents the dielectric produced from tetraethylorthosilicates. For example, Liu et al. in US Pat. Pub. No. 2005/0031789, disclose an acidic barrier slurry with the use of a quanternary ammonium salt for increasing TEOS removal rates. This slurry provides the advantage of excellent barrier removal rate with low copper rate and with a controlled TEOS removal rate. Furthermore, the hydrogen peroxide level provides an effective toggle for controlling copper removal rate. Unfortunately, these slurries lack control for low-K dielectrics, such as carbon-doped oxides (CDO).

Because integration schemes used by different IC manufacturers vary; the rate selectivity required for the various films polished in the barrier CMP step also varies. Certain film stacks require higher copper, TEOS and CDO rates for topography correction; but on other occasions, low copper, TEOS and CDO are useful. A barrier removal slurry that can correct profiles for copper, TEOS and CDO will facilitate further decreases in line width.

In view of the above, there exists a need to provide a second-step slurry that possesses a high removal rate of barrier materials, excellent selectivity to interconnect metals, controlled removal of TEOS, CDO and copper removal rates.

STATEMENT OF THE INVENTION

The invention provides a polishing solution useful for removing barrier materials in the presence of at least one nonferrous interconnect metal with limited erosion of dielectrics comprising: 0 to 20 weight percent oxidizer, at least 0.001 weight percent inhibitor for reducing removal rate of the nonferrous interconnect metals, 1 ppm to 4 weight percent organic-containing ammonium cationic salt formed with

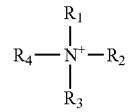

wherein $R_1$, $R_2$, $R_3$ and $R_4$ are radicals, $R_1$ has a carbon chain length of 2 to 25 carbon atoms, 1 ppm to 4 weight percent anionic surfactant, the anionic surfactant having 4 to 25 carbon atoms and the total carbon atoms of the ammonium cationic salt plus the anionic surfactant being 6 to 40 carbon atoms, 0 to 50 weight percent abrasive and balance water; and the solution having a pH of less than 7.

In another aspect, the invention provides a polishing solution useful for removing barrier materials in the presence of at least one nonferrous interconnect metal with limited erosion of dielectrics comprising: 0.001 to 15 weight percent oxidizer, at least 0.001 weight percent inhibitor for reducing removal rate of the nonferrous interconnect metals, 1 ppm to 4 weight percent organic-containing ammonium cationic salt formed with

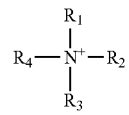

wherein $R_1$, $R_2$, $R_3$ and $R_4$ are radicals, $R_1$ has a carbon chain length of 2 to 10 carbon atoms, the organic-containing ammonium cationic salt has 5 to 25 carbon atoms, 1 ppm to 4 weight percent anionic surfactant, the anionic surfactant having 5 to 20 carbon atoms and the total carbon atoms of the ammonium cationic salt plus the anionic surfactant being 10 to 35, 0 to 50 weight percent abrasive and balance water; and the solution having a pH of less than 5.

In another aspect, the invention provides a method of polishing semiconductor substrates, including the step of polishing the semiconductor substrate with a polishing solution and a polishing pad, the polishing solution useful for removing barrier materials in the presence of at least one nonferrous interconnect metal with limited erosion of dielectrics comprising: 0 to 20 weight percent oxidizer, at least 0.001 weight percent inhibitor for reducing removal rate of the nonferrous interconnect metals, 1 ppm to 4 weight percent organic-containing ammonium cationic salt formed with

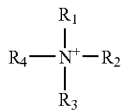

wherein $R_1$, $R_2$, $R_3$ and $R_4$ are radicals, $R_1$ has a carbon chain length of 2 to 25 carbon atoms, 1 ppm to 4 weight percent anionic surfactant, the anionic surfactant having 4 to 25 carbon atoms and the total carbon atoms of the ammonium cationic salt plus the anionic surfactant being 6 to 40 carbon atoms, 0 to 50 weight percent abrasive and balance water; and the solution having a pH of less than 7.

DETAILED DESCRIPTION

It has been discovered that anionic surfactants can work in the presence of ammonium cationic salts to increase the removal rate of carbon-doped oxides at acidic pH levels. The anionic surfactant can act in a manner that does not adversely impact removal rates of tantalum, tantalum nitride, copper or TEOS. For purposes of the specification, polishing solution refers to aqueous polishing solutions that may or may not include abrasives. If the polishing solution includes an abrasive, then the polishing solution also is a polishing slurry. The polishing solution can also optionally include surfactants, pH buffers, defoaming agents and biocides.

To polish low-k and ultra-low-k dielectric materials, it is important to maintain low pressure to decrease the delamination and fracture of these materials. However, low pressure yields low barrier material (Ta/TaN) removal rate, which is undesirable for wafer throughput. Fortunately, acidic polishing solutions have demonstrated high barrier removal rates in comparison to conventional alkaline barrier slurries that operate at low pressures. The barrier material may include the following: tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

The addition of ammonium salts facilitates controlled removal rate of silicon oxide-containing layers, such as TEOS layers at acidic pH levels; and thus they permit controlling the silicon oxide-containing material's removal rate. The ammonium salts are organic ammonium salts formed with compounds to include the structure:

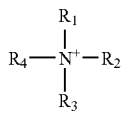

$R_1$, $R_2$, $R_3$ and $R_4$ are radicals that can be the same or different. The composition operates at acidic pH levels where the ammonium compound becomes ionized. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures thereof. It is possible to add the salt directly to the composition or to form the salt in situ. For example, adding tetrabutylammonium hydroxide (TBAH) to a nitric acid solution at a pH of 2.5 forms the tetrabutylammonium nitrate.

A preferable ammonium salt combination is that formed from reacting tetrabutylammonium hydroxide with hydrofluoric acid. This combination reacts at low pH levels to form a tetrabutylammonium fluoride salt. Although the exact mechanism is unclear (the fluoride salt dissociates to provide fluoride ions in solution), having organic ammonium fluoride salts in solution further accelerates the TEOS removal rate.

$R_1$ is an organic that has a carbon chain length of 2 to 25 carbon atoms. More preferably, $R_1$ has a carbon chain length of 2 to 10. Most preferably, $R_1$ has a carbon chain length of 2 to 5 carbon atoms. The organic of $R_1$ may be a substituted or unsubstituted aryl, alkyl, aralkyl, or alkaryl group.

Preferably, $R_2$, $R_3$ and $R_4$ are organic compounds, such as, a substituted or unsubstituted aryl, alkyl, aralkyl, or alkaryl group; or hydrogen. If $R_2$, $R_3$ or $R_4$ is an organic compound, then the organic compound preferably has a carbon chain length of 2 to 20 carbon atoms; more preferably, it has a carbon chain length of 2 to 10 carbon atoms; and most preferably, it has a carbon chain length of 2 to 5 carbon atoms. The total number of carbon atoms of the quaternary cationic ammonium salt is preferably 5 to 25. Generally, increasing the number of carbon atoms increases effectiveness, but decreases the compound's solubility. Preferably, the total carbon atoms are between 10 and 20 carbon atoms.

Suitable compounds for forming ammonium salts include tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido) propyltrimethylammonium, triethylenetetramine, tetramethylguanidine, hexylamine and mixtures thereof. Specific ammonium salts include tetraethyl ammonium nitrate, tetrabutylammonium fluoride, tetraethylammonium nitrate, tetraethylammonium fluoride, benzyltributylammonium chloride, benzyltrimethylammonium chloride, benzyltriethylammonium chloride, diallyldimethylammonium chloride, diallyldiethylammonium chloride, diethylaminoethyl methacrylate, dimethylaminoethyl methacrylate, methacryloyloxyethyltrimethylammonium sulfate, methacryloyloxyethyltrimethylammonium chloride, 3-(methacrylamido) propyltrimethylammonium chloride, triethylenetetramine, tetramethylguanidine, hexylamine and mixtures comprising at least one of the foregoing. The preferred ammonium salts are tetraethyl ammonium salts, tetrabutylammonium salts, benzyltributylammonium salts, benzyltrimethylammonium salts, benzyltriethylammonium salts and mixtures thereof.

The ammonium salts are present in an amount of 1 ppm to 4 weight percent. For purposes of this specification, all compositions are expressed in weight percent, unless specifically indicated otherwise. Preferably, the ammonium salt is present in an amount of 10 ppm to 2 weight percent. Most preferably, the ammonium salt is 25 ppm to 1 weight percent.

It has been discovered that an anionic surfactant will act in combination with the ammonium salt to accelerate the removal rate of carbon-doped oxides, such as Coral™ low-k dielectrics from Novellus Systems, Inc. The anionic surfactant has a total number of 4 to 25 carbon atoms. Preferably, the anionic surfactant has 5 to 20 and most preferably 6 to 12 carbon atoms. Example anionic salts include at least one of selected from sulfonates, sulfates, phosphates and carboxylates. Furthermore, both hydrocarbon and fluorocarbon anionic surfactants are particularly effective. Specific surfactant types include at least one of lauryl sulfosuccinate, capryl sulfonate, decylsulfate, capryl sulfate and phosphate fluorocarbons.

The anionic surfactants are present in an amount of 1 ppm to 4 weight percent. Preferably, the anionic surfactants are present in an amount of 10 ppm to 2 weight percent. Most preferably, anionic surfactants are 25 ppm to 1 weight percent.

Furthermore, because the anionic surfactant can combine with the cationic ammonium salt and precipitate from aqueous solutions, it is important to limit the total number carbon atoms between the ammonium cationic salt and the anionic surfactant. The total number of carbon atoms of 6 to 40 is particularly effective for controlling TEOS and CDO rates without adverse precipitation effects. Preferably, the total number carbon atoms between the ammonium cationic salt and the anionic surfactant is between 10 and 35 carbon atoms. Most preferably, the total number carbon atoms between the ammonium cationic salt and the anionic surfactant is between 15 and 30 carbon atoms.

The solution optionally contains 0.0005 to 5 weight percent of at least one nonferrous accelerator selected from the group of a complexing agent for complexing the nonferrous metal and a water-soluble polymer containing an acrylic acid functional group. Unless specifically expressed otherwise, this specification defines all solution ingredients in terms of weight percent. Preferably, the solution contains 0.001 to 3 weight percent of at least one nonferrous accelerator selected from the group of a complexing agent for complexing the nonferrous metal and a water-soluble polymer containing an acrylic acid functional group. Most preferably, the solution contains 0.002 to 2 weight percent of at least one nonferrous accelerator selected from the group of a complexing agent for complexing the nonferrous metal and a water-soluble polymer containing an acrylic acid functional group.

The solution optionally contains 0.02 to 2 weight percent complexing agent for the nonferrous metal. Most preferably, the solution contains 0.05 to 1 weight percent complexing agent for the nonferrous metal. Typical complexing agents include at least one of carboxylic acids, multi-carboxylic acids, aminocarboxylic acids, multi-amine compounds and mixtures thereof. Specific complexing agents include the following: acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glycolic acid, glutaric acid, salicylic acid, nitrilotriacetic acid, ethylenediamine, N-hydroxyethylethylenediaminetriacetic acid (HEDTA), hydroxyquinoline, tartaric acid, sodium diethyl dithiocarbamate, succinic acid, sulfosalicylic acid, triglycolic acid, thioglycolic acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid, salts thereof and mixtures thereof. Some organic acids, such as citric acid may serve as both a complexing agent and a pH adjusting agent. The complexing agent also provides the advantage of controlling the discoloration of the polishing solution during aging. Adding the complexing agent accelerates copper removal, but excessive complexing agent can adversely impact polishing rate.

An amount of 10 parts per billion (ppb) to 4 weight percent complexing agent can control the discoloration of the polishing solution. Insufficient complexing agent can result in unstable polishing slurries (polishing slurries that undergo a color change within too short a time period); and excessive complexing agent can adversely impact polishing rate.

The solution optionally contains a water-soluble polymer having an acrylic acid functional group for increasing the removal rate of the nonferrous interconnect metal. For example, polyacrylic acid, polymethacrylic acid, copolymers thereof and mixtures thereof are particularly effective for incrementally increasing copper removal rate. For example, an addition of 0.0005 to 5 weight percent water-soluble polymer can serve to increase the nonferrous interconnect metal rate to an acceptable level. Preferably, the solution contains 0.001 to 3 weight percent water-soluble polymer. Most preferably, the solution contains 0.002 to 3 weight percent water-soluble polymer. The water-soluble polymer has a number average molecular weight between 100 and 1,000,000. This specification defines all molecular weights in terms of number average molecular weight as determined by gel permeation chromatography. Preferably, the water-soluble polymer has a number average molecular weight between 100 and 750,000. Most preferably, the water-soluble polymer has a number average molecular weight between 100 and 500,000. Within these ranges, copolymers operate best at the high ends of the ranges.

In addition, the water-soluble polymer preferably includes an amine functional group, such as poly(acrylamide-co-acrylic acid) to limit impact upon TEOS removal rate. The amine functional groups are particularly important when the solution contains an ammonium salt. If the water-soluble polymer is not a copolymer, then low molecular weight polymers are preferable. For example, polyacrylic acid, polymethacrylic acid and mixtures thereof having a number average molecular weight of 100 to 50,000 are particularly effective for incrementally increasing copper removal rate without substantially impacting TEOS removal rate. Preferably, the polyacrylic acid, polymethacrylic acid or mixture thereof has a number average molecular weight of 100 to 20,000. Most preferably, the polyacrylic acid, polymethacrylic acid or mixture thereof has a number average molecular weight of 100 to 10,000.

The barrier metal polishing composition optionally includes an abrasive for "mechanical" removal of the barrier material. The CMP composition includes an abrasive for "mechanical" removal of barrier layers. The abrasive is preferably a colloidal abrasive. Example abrasives include the following: inorganic oxide, metal boride, metal carbide, metal hydroxide, metal nitride, or a combination comprising at least one of the foregoing abrasives. Suitable inorganic oxides include, for example, silica ($SiO_2$), alumina ($Al_2O_3$), zirconia ($ZrO_2$), ceria ($CeO_2$), manganese oxide ($MnO_2$), and mixtures thereof. Alumina is available in many forms such as alpha-alumina, gamma-alumina, delta-alumina, and amorphous (non-crystalline) alumina. Other suitable examples of alumina are boehmite (AlO(OH)) particles and mixtures thereof. Modified forms of these inorganic oxides such as polymer-coated inorganic oxide particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, and mixtures comprising at least one of the foregoing metal carbides, boride and nitrides. Diamond may also be utilized as an abrasive if desired. Alternative abrasives also include polymeric particles and coated polymeric particles. The preferred abrasive is silica.

The abrasive has a concentration in the aqueous phase of the polishing composition of 0 to 50 weight percent. For abrasive-free solutions, a fixed abrasive pad assists with the removal of the barrier layer. Preferably, the abrasive concentration is 0.1 to 40 weight percent. And most preferably, the abrasive concentration is 0.25 to 35 weight percent. Typically, increasing abrasive concentration increases the removal rate of dielectric materials; and it especially increases the removal rate of low-k dielectric materials, such as carbon-doped oxide. For example, if a semiconductor manufacturer desires an increased low-k dielectric removal rate, then increasing the abrasive content can increase the dielectric removal rate to the desired level.

The abrasive preferably has an average particle size of less than 250 nm for preventing excessive metal dishing and dielectric erosion. For purposes of this specification, particle size refers to the colloidal silica's average particle size. Most preferably, the silica has an average particle size of less than 100 nm to further reduce metal dishing and dielectric erosion. In particular, an average abrasive particle size less than 15 nm removes the barrier metal an acceptable rate without excessive removal of the dielectric material. For example, the least dielectric erosion and metal dishing occur with a colloidal silica having an average particle size is 2 to 15 nm. Decreasing the size of the colloidal silica tends to improve the selectivity of the solution; but it also tends to decrease the barrier removal rate. In addition, the preferred colloidal silica may include additives, such as dispersants to improve the stability of the silica at acidic pH ranges. One such abrasive is colloidal silica that is available from AZ Electronic Materials, of Puteaux, France.

In addition, high purity silica particles also serve to decrease the aging or yellowing rate of the polishing solutions. For example maintaining total transition metal concentration to less than 1 part per million (ppm) further increases the solution's ability to decrease yellowing. Furthermore, limiting potassium and sodium to less than 1 ppm reduces adverse diffusion of these detrimental components into dielectric layers.

Optionally, the removal rate of barrier layers, such as tantalum, tantalum nitride, titanium and titanium nitride is preferably optimized by the use of an oxidizing agent. Suitable oxidizers include, for example, hydrogen peroxide, monopersulfates, iodates, magnesium perphthalate, peracetic acid and other peracids, persulfates, bromates, periodates, nitrates, iron salts, cerium salts, manganese (Mn) (III), Mn (IV) and Mn (VI) salts, silver salts, copper salts, chromium salts, cobalt salts, halogens, hypochlorites, or combinations comprising at least one of the foregoing oxidizers. The preferred oxidizer is hydrogen peroxide. It is to be noted that the oxidizer is typically added to the polishing composition just prior to use and in these instances the oxidizer is contained in a separate package.

It is desirable to use an amount of 0 to 20 weight percent oxidizer. Preferably, the oxidizer is 0.001 to 15 weight percent. Most preferably, the composition contains 0.05 to 10 weight percent oxidizer. Adjusting the amount of oxidizer, such as peroxide can also control the metal interconnect removal rate. For example, increasing the peroxide concentration increases the copper removal rate. Excessive increases in oxidizer, however, provide an adverse impact upon polishing rate.

Additionally, the solution contains at least 0.001 weight percent inhibitor to control nonferrous interconnect removal rate by static etch or other removal mechanism. Adjusting the concentration of an inhibitor adjusts the nonferrous interconnect metal removal rate by protecting the metal from static etch. Preferably, the solution contains 0.001 to 10 weight percent inhibitor for inhibiting static etch of nonferrous metal, for example, copper interconnects. Most preferably, the solution contains 0.05 to 2 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole and imidazole. BTA is a particularly effective inhibitor for copper and silver interconnects.

The polishing composition has a pH of less than 7 and a balance water. Preferably, the pH is less than or equal to 5. Optionally, the polishing composition includes an inorganic pH adjusting agent to reduce the pH of the polishing composition to an acidic pH less than 7 with a balance water. Preferably, the pH adjusting agent only contains an impurity level concentration of metallic ions. In addition, the solution most preferably relies upon a balance of deionized water to limit incidental impurities. The pH adjusting agent can be either an organic or inorganic acid. Example organic acids include at least one of acetic acid, citric acid, malic acid, maleic acid, glycolic acid, phthalic acid, oxalic acid, malonic acid, lactic acid, succinic acid, tartaric acid and mixtures thereof. Preferably, the pH adjusting agent is an inorganic acid, such as nitric acid, sulfuric acid, hydrochloric acid, hydrofluoric acid and phosphoric acid. The most advantageous pH adjusting agent is nitric acid ($HNO_3$). Typically, the solution has a pH of 1.5 to 5. Most preferably, the pH is 2 to 4.

At a pH below 5, the polishing composition can provide a high barrier metal removal rate, even with a relatively low abrasive concentration. This low abrasive concentration can improve the polishing performance of a CMP process by reducing undesired abrasive induced defects, such as scratching. In addition, at a pH below 4, the polishing composition can be formulated with abrasive particles having a relatively small particle size. For example, a particle size of as small as approximately 10 nm still provides an acceptable Ta/TaN removal rate. By employing an abrasive having a relatively small particle size and formulating the acidic polishing composition at a low abrasive concentration, polishing defects are reduced to excellent levels.

The solution enables the CMP apparatus to operate with a low pad pressure, for example at 7.5 to 25 kPa and, in certain cases, even below 7.5 kpa. The low CMP pad pressure improves polishing performance by reducing scratching and other undesired polish defects and decreases damage to fragile materials. For example, low dielectric constant materials fracture and delaminate, if exposed to high compressive forces. Further, the high barrier metal removal rate obtained by the acidic polishing solution enables effective barrier metal polishing using a low abrasive concentration and a small particle size.

For purposes of this specification, useful for preferentially removing barrier materials in the presence of nonferrous interconnect metals refers to removing the barrier material at a rate, as expressed in Angstroms per minute, of greater than the removal rate of the interconnect metal. Typically, the polishing solution has a tantalum nitride to copper selectivity of at least 1 to 1 as measured with a polishing pad pressure measured normal to a wafer less than 15 kPa. Preferably, the polishing solution has a tantalum nitride to copper selectivity of at least 1.5 to 1 as measured with a polishing pad pressure measured normal to a wafer less than 15 kPa. Most preferably, the polishing solution has a tantalum nitride to copper selectivity of at least 2 to 1. A specific example for testing the selectivity is the conditions, including the polyurethane polishing pad, of Example 1. This high level of selectivity allows a chip manufacturer to remove the barrier material without removing excess dielectric or interconnect material.

For purposes of this specification, limited dielectric erosion refers to a chemical mechanical polishing process where after polishing, the dielectric has sufficient thickness to act on behalf of its intended purpose, such as being a semiconducting, masking or barrier material. In addition, the polishing solution provides a flexible tantalum nitride to dielectric or CDO selectivity. For example, the polishing solution has a tantalum nitride to TEOS or CDO selectivity of 1 to 2 to as high as 10 to 1 as measured with a polishing pad pressure measured normal to a wafer less than 15 kPa. A specific example for testing the selectivity is the conditions of Example 1, including the polyurethane polishing pad.

The polishing composition can also optionally include buffering agents such as various organic and inorganic acids, and amino acids or their salts with a pKa in the pH range of 1.5 to less than 4. The polishing composition can further optionally include defoaming agents, such as non-ionic surfactants including esters, ethylene oxides, alcohols, ethoxylate, silicon compounds, fluorine compounds, ethers, glycosides and their derivatives, and the like. The defoaming agent can also be an amphoteric surfactant. The polishing composition may optionally contain biocides, such as Kathon® ICP III, containing active ingredients of 2-methyl-4-isothiazolin-3-one and 5-chloro-2-methyl-4-isothiazolin-3-one (Kathon is a registered trademark of Rohm and Haas Company).

EXAMPLES

A list of solution compositions shown in Tables 1 to 5 were prepared to evaluate the performance of various anionic surfactants at varying concentration levels. In the preparation of the compositions the requisite amounts of all required chemicals as shown (with the exception of the hydrogen peroxide and the abrasive) were added to deionized water in a container. The solution in the container was stirred until all the ingredients were dissolved in water. The abrasive was then added to the container. The pH of the solution was then adjusted to the target pH by the addition of nitric acid. Following this, the hydrogen peroxide was added to the container for use as a polishing composition. For purposes of this specification, letters represent comparative examples and numbers represent examples of the invention.

Example 1

The polishing was performed using a Mirra® model polishing tool manufactured by applied Materials. The polishing pad was a Politex™ High E porous polyurethane pad supplied by Rohm and Haas Electronic Materials CMP Technologies. The pad was conditioned prior to each run with a diamond abrasive plate manufactured by Kinik having 180 μm diamonds. The polishing process was performed at a membrane pressure of 10.33 kPa (1.5 psi), a table speed of 93 revolutions per minute (rpm) and a carrier speed of 87 rpm. The polishing composition supply rate was 200 ml/min using 200 mm blanket wafers from ATDF, Inc. Cu and TaN removal rates were measured on a Four-Point Probe CDE Resmap. Copper, TaN, TEOS and Coral® carbon-doped oxide (CDO) film removal rates were measured by a ThermaWave Optiprobe®) 2600 metrology tool and an Orbot™ WF-720 from Applied Materials measured defectivity. Tables 1 to 4 below provide the polishing results.

TABLE 1

| Sample | BTA (wt %) | $H_2O_2$ (wt %) | pH | Silica (wt %) | TBAH (wt %) | Polystep B29 Surfactant (wt %) | TaN (Å/min) | TEOS (Å/min) | CDO (Å/min) | Cu (Å/min) |
|---|---|---|---|---|---|---|---|---|---|---|
| A | 0.2 | 0.5 | 4 | 3.5 | 0.200 | 0 | 1433 | 808 | 100 | 86 |
| 1 | 0.15 | 0.5 | 3.5 | 4.0 | 0.200 | 0.03 | 1393 | 715 | 326 | 273 |
| 2 | 0.15 | 0.5 | 3.5 | 4 | 0.200 | 0.06 | 1302 | 674 | 489 | 272 |
| 3 | 0.15 | 0.5 | 3.5 | 4 | 0.200 | 0.1 | 1216 | 586 | 440 | 142 |
|   |   |   |   |   |   | Polystep B25 Surfactant (wt %) |   |   |   |   |
| 4 | 0.15 | 0.5 | 3.5 | 4 | 0.200 | 0.01 | 1268 | 644 | 403 | 180 |
| 5 | 0.15 | 0.5 | 3.5 | 4 | 0.200 | 0.03 | 1002 | 446 | 312 | 58 |
| 6 | 0.15 | 0.5 | 3.5 | 4 | 0.200 | 0.1 | 40 | 38 | 72 | 50 |

BTA = benzotriazole,
silica was 25 nm average particle size from AZ Electronics,
TBAH = tetrabutylammonium hydroxide,
CDO = Coral ™ carbon-doped oxide from Novellus Systems, Inc. and
Polystep B29 surfactant = Sodium capryl sulfate or Sulfuric acid, monooctyl ester, sodium salt (8 total carbon atoms) from Stepan Company and
Polystep B25 surfactant = Sulfuric acid, monodecyl ester, sodium salt from Stepan Company.

TABLE 2

| Sample | BTA (wt %) | H$_2$O$_2$ (wt %) | pH | Silica (wt %) | TBAH (wt %) | Bioterge PAS-8S Surfactant (wt %) | TaN (Å/min) | TEOS (Å/min) | CDO (Å/min) | Cu (Å/min) |
|---|---|---|---|---|---|---|---|---|---|---|
| 7 | 0.15 | 0.5 | 3.5 | 4 | 0.200 | 0.01 | 1411 | 751 | 104 | 198 |
| 8 | 0.15 | 0.5 | 3.5 | 4 | 0.200 | 0.03 | 1379 | 723 | 265 | 164 |
| 9 | 0.15 | 0.5 | 3.5 | 4 | 0.200 | 0.055 | 1247 | 538 | 431 | 273 |
| 10 | 0.15 | 0.5 | 3.5 | 4 | 0.200 | 0.08 | 1174 | 610 | 483 | 341 |
| 11 | 0.15 | 0.5 | 3.5 | 4 | 0.200 | 0.1 | 1196 | 514 | 508 | 328 |
| 12 | 0.15 | 0.5 | 3.5 | 4 | 0.200 | 0.1 | 1347 | 625 | 505 | 403 |
| 13 | 0.15 | 0.5 | 3.5 | 4 | 0.200 | 0.3 | 1245 | 272 | 357 | 203 |

BTA = benzotriazole,
silica was 25 nm average particle size from AZ Electronics,
TBAH = tetrabutylammonium hydroxide,
CDO = Coral ™ carbon-doped oxide from Novellus Systems, Inc. and
Bioterge PAS-8S surfactant = Sodium octane sulfonate having a formula of CH3(CH2)6CH2SO3Na (8 total carbon atoms) from Stepan Company.

TABLE 3

| Sample | BTA (wt %) | H$_2$O$_2$ (wt %) | pH | Silica (wt %) | TBAH (wt %) | Morewet DB Surfactant (wt %) | TaN (Å/min) | TEOS (Å/min) | CDO (Å/min) | Cu (Å/min) |
|---|---|---|---|---|---|---|---|---|---|---|
| 14 | 0.15 | 0.5 | 3.5 | 4 | 0.200 | 0.01 | 1278 | 731 | 286 | 163 |
| 15 | 0.15 | 0.5 | 3.5 | 4 | 0.200 | 0.03 | 1202 | 526 | 538 | 77 |
| 16 | 0.15 | 0.5 | 3.5 | 4 | 0.200 | 0.1 | 783 | 194 | 446 | 18 |

BTA = benzotriazole,
silica was 25 nm average particle size from AZ Electronics,
TBAH = tetrabutylammonium hydroxide,
CDO = Coral ™ carbon-doped oxide from Novellus Systems, Inc. and
Morewet DB Surfactant = sodium dibutyl naphthalene sulfonate (18 total carbon atoms) from Witco Company.

TABLE 4

| Sample | BTA (wt %) | H$_2$O$_2$ (wt %) | Silica (wt %) | pH | TBAH (wt %) | Monomate LNT-40 Surfactant (wt %) | TaN RR | TEOS RR | CDO RR | SiCN RR | Cu RR | SiN RR | Ta RR |
|---|---|---|---|---|---|---|---|---|---|---|---|---|---|
| B | 0.60 | 0.5 | 4 | 2.5 | 0.085 |  | 1232 | 586 | 89 | 63 | 72 | 49 | 631 |
| 17 | 0.60 | 0.5 | 4 | 2.5 | 0.085 | 0.03 | 791 | 308 | 486 | 34 | 149 | 45 | 377 |
| 18 | 0.60 | 0.5 | 4 | 2.5 | 0.085 | 0.09 | 605 | 121 | 336 | 147 | 12 | 41 | 296 |

RR = removal rate in Å/minute,
BTA = benzotriazole,
silica was 25 nm average particle size from AZ Electronics,
TBAH = tetrabutylammonium hydroxide,
CDO = Coral ™ carbon-doped oxide from Novellus Systems, Inc. and
Monomate LNT-40 Surfactant = ammonium lauryl sulfosuccinate (16 total carbon atoms) from Uniqema Company Tables 1 to 4 illustrate that anionic hydrocarbon surfactants are effective in combination with TBAH to increase the removal rate of carbon-doped oxide. In particular, the anionic surfactant increases CDO removal rate in acidic barrier slurries without a significant adverse effect on tantalum nitride, TEOS or copper removal rates. The Bioterge PAS-8S, Polystep B25 and Polystep B29 surfactants provided effective examples of combinations with quaternary ammonium for CDO and TEOS removal rate properties. These surfactants facilitate the tailoring of TEOS and CDO removal rates to improve planarity from the tantalum removal step.

Example 2

The polishing was performed using a Strasbaugh model 6EC polishing tool. The polishing pad was a Politex™ porous polyurethane pad supplied by Rohm and Haas Electronic Materials CMP Technologies. The pad was conditioned prior to each run with a diamond abrasive plate manufactured by Kinik having 180 μm diamonds. The polishing process was performed at a membrane pressure of 10.33 kPa (1.5 psi), a table speed of 93 revolutions per minute (rpm) and a carrier speed of 87 rpm. The polishing composition supply rate was 200 ml/min using 200 mm blanket wafers from ATDF, Inc. Cu and TaN removal rates were measured on a Four-Point Probe CDE Resmap. Copper, TaN, TEOS and Coral® carbon-doped oxide (CDO) film removal rates were measured by a ThermaWave Optiprobe® 2600 metrology tool and an Orbot® WF-720 from Applied materials measured defectivity. Tables 5 below provides the polishing results.

TABLE 5

| Slurry | Zonyl FSP Surfactant (wt %) | Silica (wt %) | H$_2$O$_2$ (wt %) | Final pH | Ta (Å/min) | Cu (Å/min) | TEOS (Å/min) | CDO (Å/min) |
|---|---|---|---|---|---|---|---|---|
| C  |      | 4 | 0.6 | 2.6 | 653 | 143 | 881 | 108 |
| 19 | 0.05 | 4 | 0.6 | 2.6 | 614 | 94  | 774 | 393 |
| 20 | 0.1  | 4 | 0.6 | 2.6 | 616 | 67  | 695 | 441 |
| 21 | 0.2  | 4 | 0.6 | 2.6 | 656 | 203 | 639 | 551 |
| 22 | 0.4  | 4 | 0.6 | 2.6 | 517 | 106 | 150 | 393 |

All samples contained 0.6 weight percent benzotriazole, 0.003842 weight percent Trilion BS EDTA from BASF, and 0.085 weight percent TBAH;
silica was 25 nm average particle size from AZ Electronics,
CDO = Black Diamond ™ carbon doped oxide from Applied materials and Zonyl FSP fluorocarbon surfactant from DuPont.

The structure of Zonyl FSP surfactant is as follows:

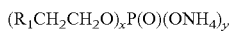

Where $R_1=F(CF_2CF_2)_z$
x=1 or 2
y=2 or 1
x+y=3
z=1 to about 7

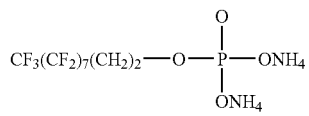

When
x=1
y=2
z=4

This molecule has about ten carbon atoms.

Tables 5 illustrates that anionic fluorocarbon surfactants are effective in combination with TBAH to increase the removal rate of carbon-doped oxide. In particular, the anionic surfactant increases CDO removal rate in acidic barrier slurries without a significant adverse effect on tantalum nitride, TEOS or copper removal rates. These surfactants facilitate the tailoring of TEOS and CDO removal rates to improve planarity from the tantalum removal step.

In summary, the combination provides a low-pH polishing solution with excellent tantalum barrier removal, controlled copper, TEOS and CDO removal rates. Furthermore, it possesses both a rapid removal of barrier materials, excellent selectivity to interconnect metals, excellent wafer defectivity. Optionally, abrasive particles may increase low-k dielectric removal rate and the complexing agent and acrylic acid polymer control the copper removal rate to provide polishing solutions adaptable for several integration schemes.

The invention claimed is:

1. A polishing solution useful for removing barrier materials in the presence of at least one nonferrous interconnect metal with limited erosion of dielectrics comprising: 0 to 20 weight percent oxidizer, at least 0.001 weight percent inhibitor for reducing removal rate of the nonferrous interconnect metals, 1 ppm to 4 weight percent organic-containing ammonium cationic salt formed with

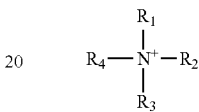

wherein the ammonium cationic salt is selected from at least one of tetrabutylammonium salts, benzyltributylammonium salts, benzyltrimethylammonium salts, benzyltriethylammonium salts and mixtures thereof, 1 ppm to 4 weight percent anionic surfactant for increasing removal rate of carbon-doped oxide, the anionic surfactant having 4 to 25 carbon atoms and the total carbon atoms of the ammonium cationic salt plus the anionic surfactant being 6 to 40 carbon atoms, 0 to 50 weight percent abrasive and balance water; and the solution having a pH of less than 5 with a tantalum nitride to copper selectivity of at least a 1 to 1 ratio as measured in Angstroms per minute with a polishing pad pressure normal to a wafer less than 15 kPa and with a tantalum nitride to carbon-doped oxide selectivity of a 1 to 2 ratio to a 10 to 1 ratio as measured in Angstroms per minute with the polishing pad pressure normal to the wafer less than 15 kPa.

2. The polishing solution of claim 1 wherein the anionic surfactant includes at least one of selected from sulfonates, sulfates, phosphates and carboxylates.

3. The polishing solution of claim 2 wherein the anionic surfactant is a hydrocarbon or a fluorocarbon.

4. The polishing solution of claim 3 wherein the anionic surfactant is selected from at least one of lauryl sulfosuccinate, capryl sulfonate, decylsulfate, capryl sulfate, and phosphate fluorocarbons.

5. A polishing solution useful for removing barrier materials in the presence of at least one nonferrous interconnect metal with limited erosion of dielectrics comprising: 0.001 to 15 weight percent oxidizer, at least 0.001 weight percent inhibitor for reducing removal rate of the nonferrous interconnect metals, 1 ppm to 4 weight percent organic-containing ammonium cationic salt formed with

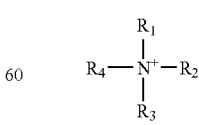

wherein the ammonium cationic salt is selected from at least one of tetrabutylammonium salts, benzyltributylammonium salts, benzyltrimethylammonium salts, benzyltriethylammonium salts and mixtures thereof, 1 ppm to 4 weight percent anionic surfactant for increasing removal rate of carbon-doped oxide, the anionic surfactant having 5 to 20 carbon atoms and the total carbon atoms of the ammonium cationic salt plus the anionic surfactant being 10 to 35, 0 to 50 weight percent abrasive and balance water; and the solution having a pH of less than 5 with a tantalum nitride to copper selectivity of at least a 1 to 1 ratio as measured in Angstroms per minute with a polishing pad pressure normal to a wafer less than 15 kPa and with a tantalum nitride to carbon-doped oxide selectivity of a 1 to 2 ratio to a 10 to 1 ratio as measured in Angstroms per minute with the polishing pad pressure normal to the wafer less than 15 kPa.

6. The polishing solution of claim 5 wherein the anionic surfactant includes at least one of selected from sulfonates, sulfates, phosphates and carboxylates.

7. The polishing solution of claim 6 wherein the anionic surfactant is a hydrocarbon or a fluorocarbon.

8. The polishing solution of claim 7 wherein the anionic surfactant is selected from at least one of lauryl sulfosuccinate, capryl sulfonate, decylsulfate, capryl sulfate, and phosphate fluorocarbons.

9. The polishing solution of claim 8 wherein the solution contains a complexing agent includes at least one selected from the group comprising acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glycolic acid, glutaric acid, salicylic acid, nitrilotriacetic acid, ethylenediamine, N-hydroxyethylethylenediaminetriacetic acid (HEDTA), hydroxyqunoline, tartaric acid, sodium diethyl dithiocarbamate, succinic acid, sulfosalicylic acid, triglycolic acid thioglycolic acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid, salts thereof and mixtures thereof.

10. The polishing solution of claim 1 wherein the ammonium cationic salt is a tetrabutylammonium salt.

11. The polishing solution of claim 5 wherein the ammonium cationic salt is a tetrabutylammonium salt.

* * * * *